United States Patent
Wu et al.

(10) Patent No.: US 9,916,982 B1
(45) Date of Patent: Mar. 13, 2018

(54) DIELECTRIC PRESERVATION IN A REPLACEMENT GATE PROCESS

(71) Applicant: GLOBALFOUNDRIES Inc., Grand Cayman (KY)

(72) Inventors: Xusheng Wu, Ballston Lake, NY (US); Haigou Huang, Rexford, NY (US); John Zhang, Altamont, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/383,461

(22) Filed: Dec. 19, 2016

(51) Int. Cl.
| | |
|---|---|
| *H01L 29/78* | (2006.01) |
| *H01L 21/28* | (2006.01) |
| *H01L 29/66* | (2006.01) |
| *H01L 21/311* | (2006.01) |
| *H01L 21/8234* | (2006.01) |
| *H01L 21/283* | (2006.01) |

(52) U.S. Cl.
CPC ...... *H01L 21/28008* (2013.01); *H01L 21/283* (2013.01); *H01L 21/31111* (2013.01); *H01L 21/8234* (2013.01); *H01L 21/823437* (2013.01); *H01L 21/823468* (2013.01); *H01L 29/6656* (2013.01); *H01L 29/66545* (2013.01); *H01L 29/66795* (2013.01); *H01L 29/78* (2013.01)

(58) Field of Classification Search
None
See application file for complete search history.

(56) References Cited

U.S. PATENT DOCUMENTS

| | | | |
|---|---|---|---|
| 8,536,040 B1 * | 9/2013 | Park | H01L 29/49 257/E21.198 |
| 9,406,767 B1 * | 8/2016 | Greene | H01L 29/42368 |
| 9,443,738 B2 | 9/2016 | Zang et al. | |
| 9,443,944 B2 | 9/2016 | Zang et al. | |
| 9,773,865 B2 * | 9/2017 | Chan | H01L 29/0649 |
| 2012/0248550 A1 * | 10/2012 | Huang | H01L 29/66545 257/410 |
| 2013/0187235 A1 * | 7/2013 | Huang | H01L 21/823821 257/369 |
| 2013/0299922 A1 * | 11/2013 | Choi | H01L 21/8234 257/412 |

* cited by examiner

*Primary Examiner* — Minh-Loan Tran
(74) *Attorney, Agent, or Firm* — Thompson Hine LLP; Anthony Canale

(57) ABSTRACT

Structures for use in a replacement gate process involving a field-effect transistor and methods for forming such structures. A first dielectric layer is formed adjacent to a dummy gate structure, and a second dielectric layer is formed on the first dielectric layer. After the second dielectric layer is formed, a portion of the dummy gate structure is removed with an etching process to cut the dummy gate structure into disconnected segments. The second dielectric layer caps the first dielectric layer when the portion of the dummy gate structure is removed. The second dielectric layer has a higher etch rate selectivity than the first dielectric layer to the etching process.

14 Claims, 6 Drawing Sheets

DIELECTRIC PRESERVATION IN A REPLACEMENT GATE PROCESS

BACKGROUND

The present invention relates to semiconductor device fabrication and integrated circuits and, more specifically, to structures for use in a replacement gate process involving a field-effect transistor and methods for forming such structures.

Complementary-metal-oxide-semiconductor (CMOS) processes may be used to build a combination of p-channel and n-channel field-effect transistors (nFETs and pFETS) that are coupled to implement logic gates and other types of circuits, such as switches. Field-effect transistors generally include an active semiconductor region, a source, a drain, and a gate electrode. When a control voltage exceeding a threshold voltage is applied to the gate electrode, an inversion or depletion layer is formed in a channel defined in the active semiconductor region between the source and drain by the resultant electric field, and carrier flow occurs between the source and drain to produce a device output current.

In a typical replacement metal gate process, sacrificial gate structures are used for forming a self-aligned gate-to-source/drain structure. The sacrificial gate structures are removed and replaced with a gate structure that includes a desired gate dielectric and gate electrode. In a gate-last process, gate height control is relevant to proper transistor function because variations in gate height may lead to measurable transistor performance variability. During reactive ion etching used to pattern a hardmask for a gate cut and subsequent reactive ion etching to remove the sacrificial gate structures at the location of the gate cut, an interlayer dielectric layer comprised of silicon dioxide and surrounding the sacrificial gate structures is exposed to the etching process. Due to poor etch rate selectivity, the interlayer dielectric layer may be recessed relative to the sacrificial gate structures at the location of the gate cut. Chemical mechanical polishing is used to expose the sacrificial gate structure for subsequent removal and also used to remove excess final gate fill metal after the replacement gate structure is finished. An inability to exert control over the CMP process must result in an inability to control the final gate height and introduces topography due to recessing of the interlayer dielectric surrounding the sacrificial gate structures.

Improved structures for use in a replacement gate process involving a field-effect transistor and methods for forming such structures are needed.

SUMMARY

In an embodiment of the invention, a method includes forming a dummy gate structure, forming a first dielectric layer adjacent to the dummy gate structure, and forming a second dielectric layer on the first dielectric layer. After the second dielectric layer is formed, a portion of the dummy gate structure is removed with an etching process to cut the dummy gate structure into disconnected segments. The second dielectric layer caps the first dielectric layer when the portion of the dummy gate structure is removed. The second dielectric layer has a higher etch rate selectivity than the first dielectric layer to the etching process.

In an embodiment of the invention, a structure includes a first dielectric layer comprised of a first dielectric material, and a second dielectric layer comprised of a second dielectric material. The second dielectric layer is arranged in a stack as a cap on the first dielectric layer. A first gate structure extends through the first dielectric layer and the second dielectric layer. A second gate structure also extends through the first dielectric layer and the second dielectric layer. The second gate structure has an end arranged with an end-to-end arrangement relative to an end of the first gate structure. An isolation region is located between the end of the first gate structure and the end of the second gate structure.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 8 is a top view of the substrate portion in which FIG. 7 is taken generally along line 7-7.

DETAILED DESCRIPTION

Figure 1:
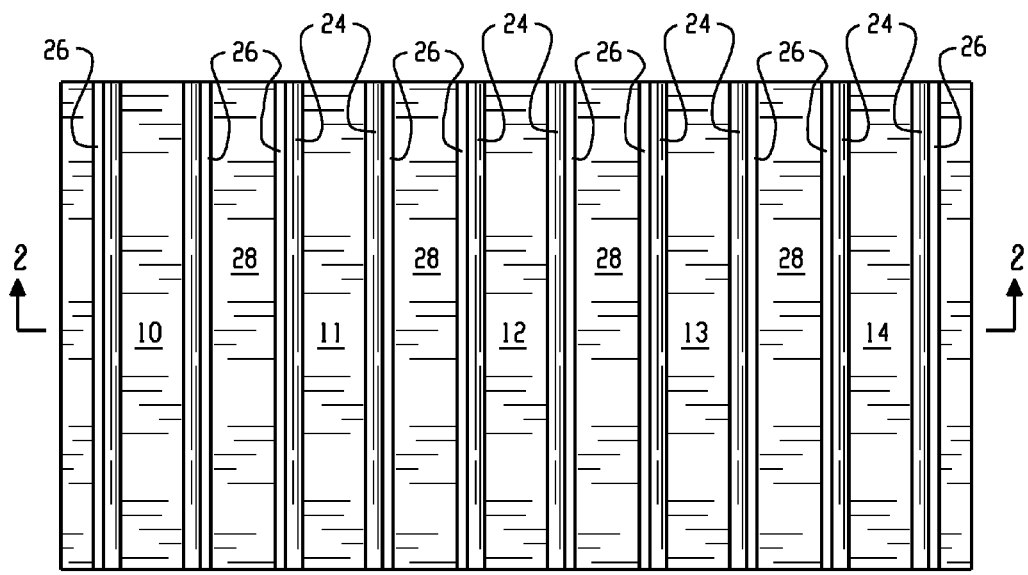
FIG. 1 is a top view of a portion of a substrate at an initial fabrication stage of a processing method in accordance with embodiments of the invention.
Figure 2:
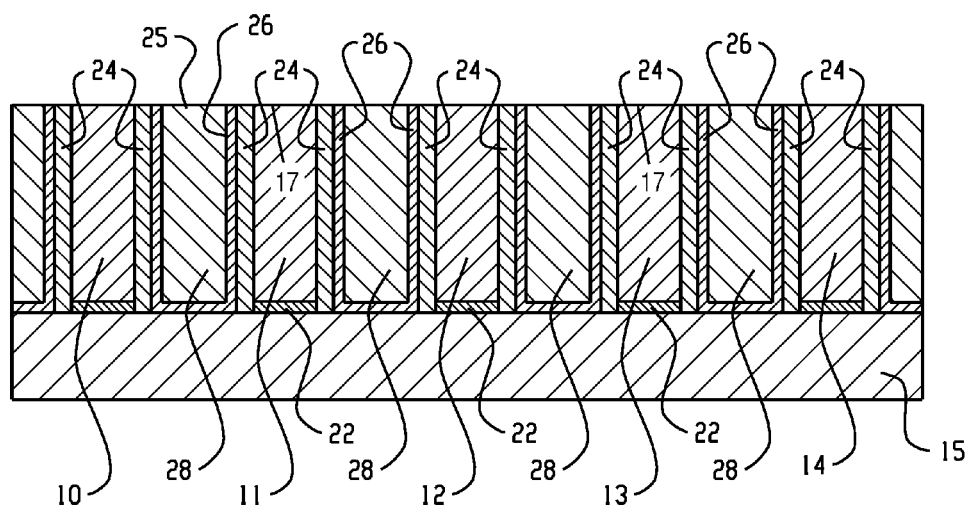
FIG. 2 is a cross-sectional view taken generally along line 2-2 in FIG. 1.

With reference to FIGS. 1, 2 and in accordance with embodiments of the invention, sacrificial gate structures 10, 11, 12, 13, 14 are located on the top surface of an active device region 15 comprising a portion of a substrate. The substrate may be a bulk substrate or a device layer of a semiconductor-on-insulator (SOI) substrate. The active device region 15 may include, for example, a semiconductor fin and trench isolation. The active device region 15 may include a semiconductor body for use in front-end-of-line (FEOL) device fabrication, as well as trench isolation. For example, the active device region 15 may include a semiconductor fin as the semiconductor body. The sacrificial gate structures 10-14 may be composed of a semiconductor material such as polysilicon deposited by chemical vapor deposition (CVD) and patterned with reactive ion etching (RIE).

Sections of a dielectric layer 22 separate the sacrificial gate structures 10-14 from the top surface of the active device region 15. The dielectric layer 22 may be comprised of a dielectric material, such as silicon dioxide ($SiO_2$), deposited by CVD. Spacers 24 are located adjacent to the vertical sidewalls of the sacrificial gate structures 10-14. The spacers 24 may be comprised of a low-k dielectric material, such as silicon oxycarbide (SiOC), that is deposited and anisotropically etched. An etch stop layer 28 lines the cavities between the adjacent sacrificial gate structures 10-14. The etch stop layer 28 may be comprised of a dielectric material, such as silicon nitride ($Si_3N_4$), deposited by CVD. An interlayer dielectric layer 26, such as silicon dioxide ($SiO_2$) deposited by CVD and planarized using chemical mechanical polishing (CMP) to define a top surface 25, fills the spaces between the sacrificial gate structures 10-14. A polishing step, which may be the same process used to planarize the interlayer dielectric layer 26, is performed to reveal or expose the top surfaces 17 of the sacrificial gate structures 10-14.

Figure 3:
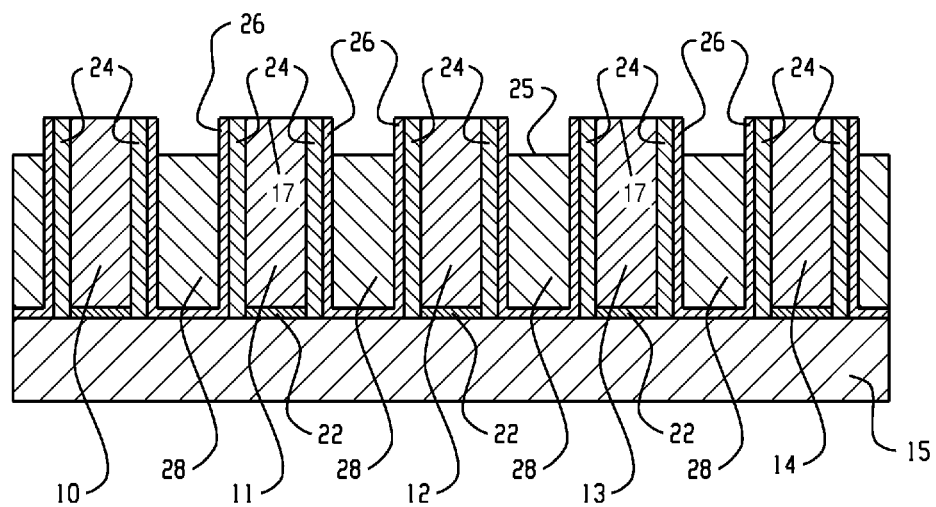
FIGS. 3-7 are cross-sectional views of the substrate portion at successive fabrication stages subsequent to FIG. 2.

With reference to FIG. 3 in which like reference numerals refer to like features in FIG. 2 and at a subsequent fabrication stage, the top surface 25 of the interlayer dielectric layer 26 is recessed relative to the top surfaces 17 of the sacrificial gate structures 10-14. The recessed top surface 25 of the interlayer dielectric layer 26 is spaced by a depth, D, from the top surfaces 17 of the sacrificial gate structures 10-14. If the interlayer dielectric layer 26 is comprised of silicon dioxide ($SiO_2$), a wet chemical etch using an etchant solution containing hydrofluoric acid (HF) may be used to recess the interlayer dielectric layer 26. The material constituting the interlayer dielectric layer 26 is chosen to be selectively removed relative to the respective materials constituting the sacrificial gate structures 10-14 and spacers 24 such that the recessing is accomplished without significant erosion of the sacrificial gate structures 10-14 or spacers 24. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 4:
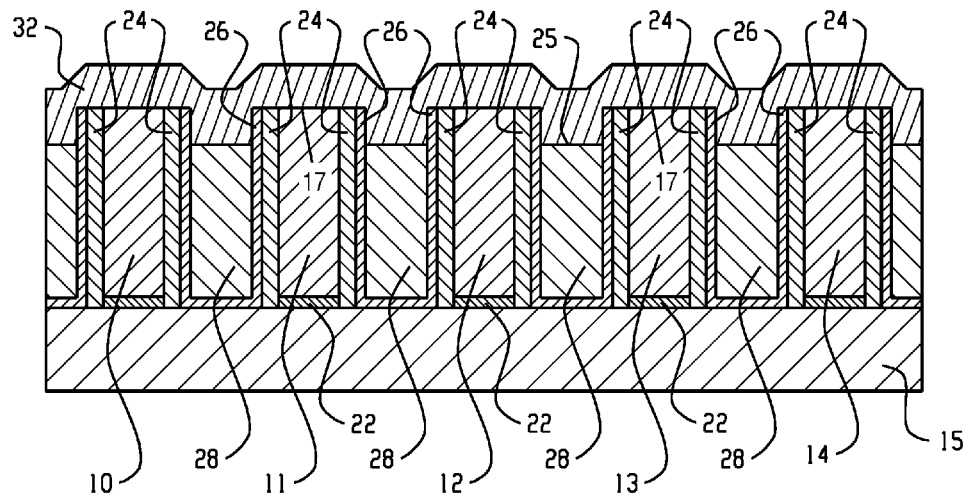

With reference to FIG. 4 in which like reference numerals refer to like features in FIG. 3 and at a subsequent fabrication stage, a conformal layer 32 is formed that covers the top surface 25 of the interlayer dielectric layer 26 and the top surfaces 17 of the sacrificial gate structures 10-14. The thickness of the conformal layer 32 is greater than (i.e., exceeds) the depth of recessing of the top surface 25 of the interlayer dielectric layer 26.

The conformal layer 32 may be composed of an electrically-insulating dielectric material, such as a low-k dielectric material characterized by a relative permittivity or dielectric constant that is less than the dielectric constant of silicon dioxide ($SiO_2$), which is about 3.9. In embodiments, the low-k dielectric material constituting the conformal layer 32 may be silicon oxycarbide (SiOC) or silicon oxycarbonitride (SiOCN) deposited by CVD. In an embodiment, the dielectric material constituting the dielectric layer 22 is not a low-k dielectric material in contrast to the composition of the conformal layer 32. The dielectric material constituting the conformal layer 32 is removable selective to the dielectric material of the interlayer dielectric layer 26. The etch rate selectivity between the dielectric material of the conformal layer 32 and the dielectric material of the interlayer dielectric layer 26 may be greater than or equal to 30:1.

Figure 5:
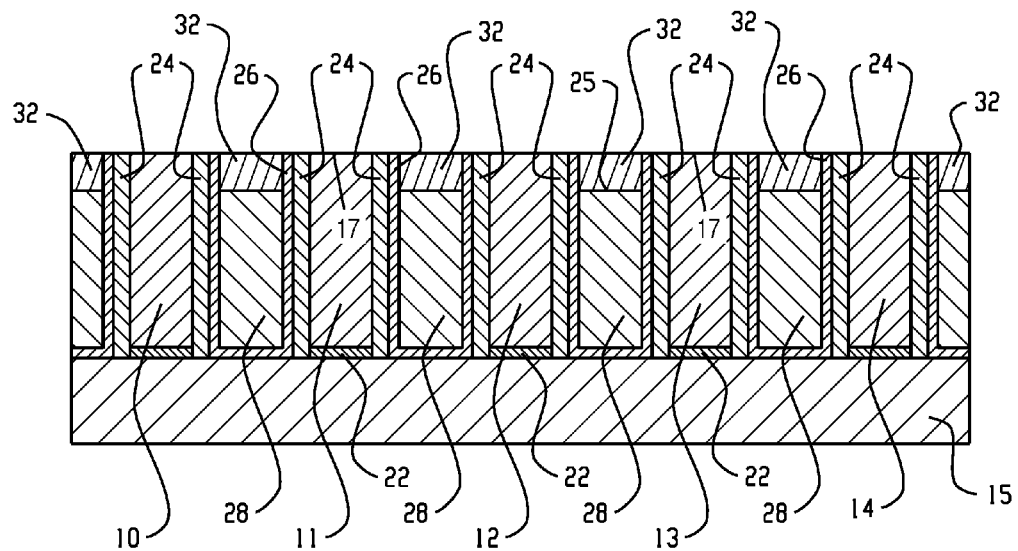

With reference to FIG. 5 in which like reference numerals refer to like features in FIG. 4 and at a subsequent fabrication stage, the conformal layer 32 is planarized using, for example, a chemical mechanical polishing (CMP) process to provide a flat surface that is coplanar with the top surfaces 17 of the sacrificial gate structures 10-14. Material removal during the chemical mechanical polishing process combines abrasion and an etching effect that polishes and removes the targeted material of conformal layer 32. The chemical mechanical polishing process may be conducted with a commercial tool using a polishing pad and a slurry selected to polish the targeted material of conformal layer 32 with a low removal rate and to stop on the material of the sacrificial gate structures 10-14.

Each of the spaces between the sacrificial gate structures 10-14 is filled by a composite layer of dielectric material that includes a section of the interlayer dielectric layer 26 and a cap comprised of a section of the conformal layer 32 located on the section of the interlayer dielectric layer 26. Each section of the interlayer dielectric layer 26 is located between the capping section of the conformal layer 32 and the top surface of the active device region 15.

Figure 6:
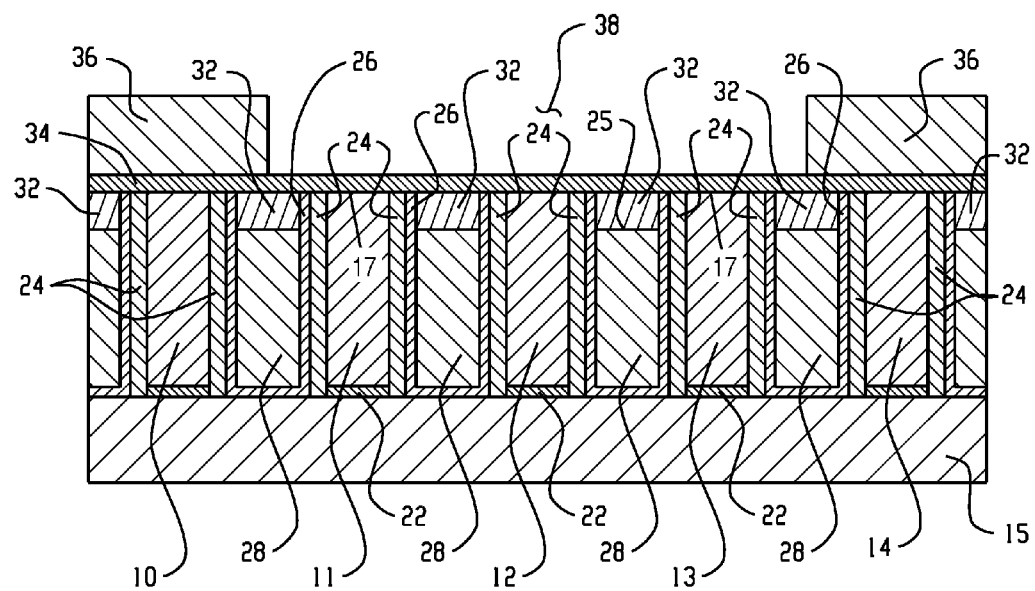

With reference to FIG. 6 in which like reference numerals refer to like features in FIG. 5 and at a subsequent fabrication stage, a hardmask layer 34 is formed on the top surfaces 17 of the sacrificial gate structures 10-14 and on the top surface of conformal layer 32 located between the sacrificial gate structures 10-14. The material forming the hardmask layer 34 may be chosen to etch selectively to the dielectric material constituting the conformal layer 32. In an embodiment, the hardmask layer 34 may be composed of a dielectric material, such as silicon nitride ($Si_3N_4$), deposited by CVD.

A photoresist layer 36 is applied on the hardmask layer 34 and lithographically patterned to define an opening 38. The photoresist layer 36 may be applied as a coating by a spin coating process, pre-baked, exposed to light projected through a photomask, baked after exposure, and developed with a chemical developer to form the opening 38. The opening 38 exposes an area on the hardmask layer 34 that is located above sacrificial gate structures 11, 12, 13.

Figure 7:
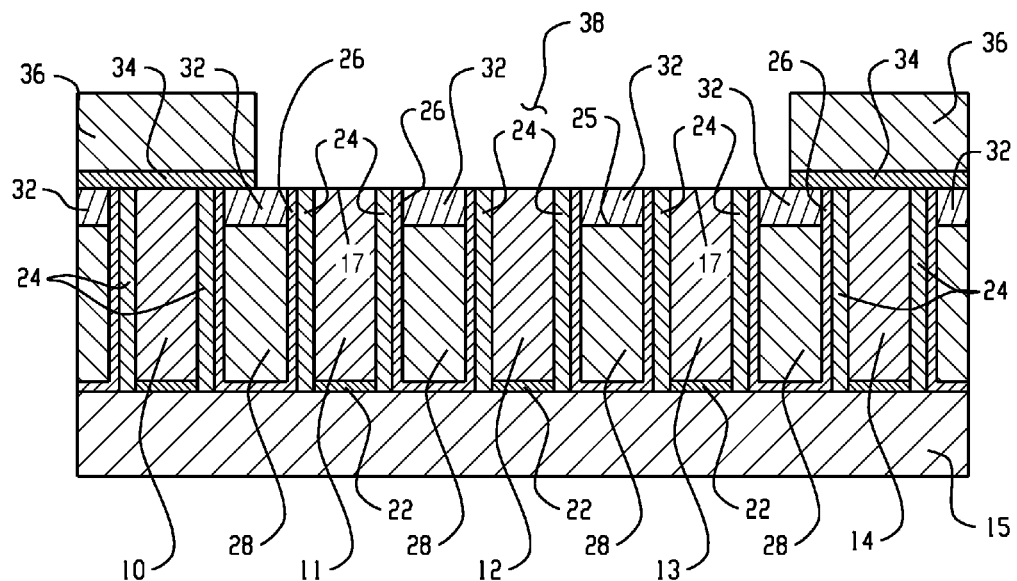
Figure 8:
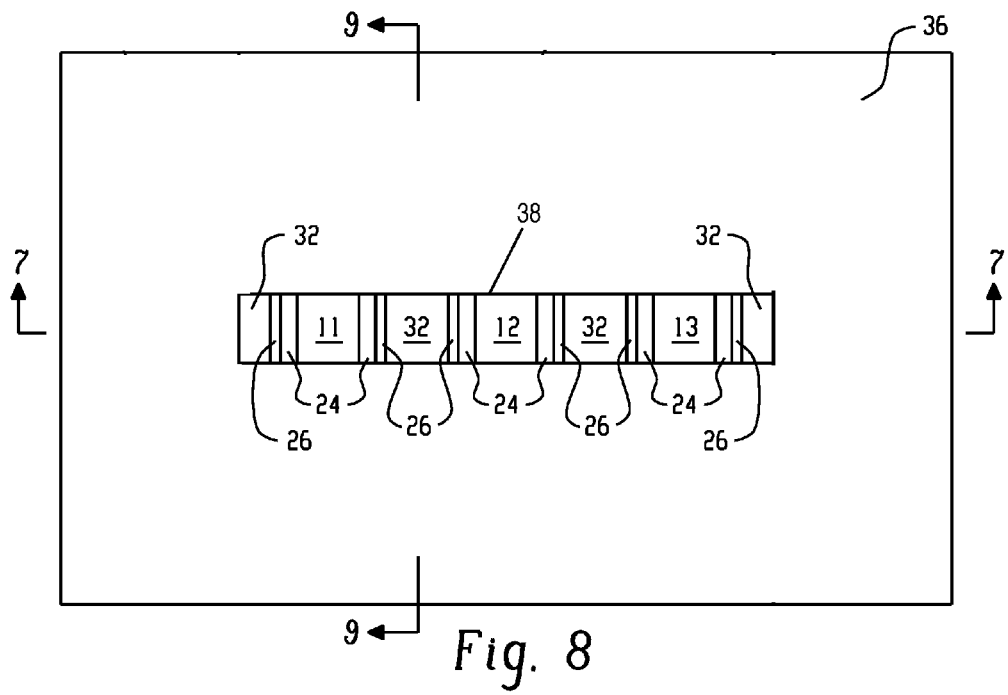
Figure 9:
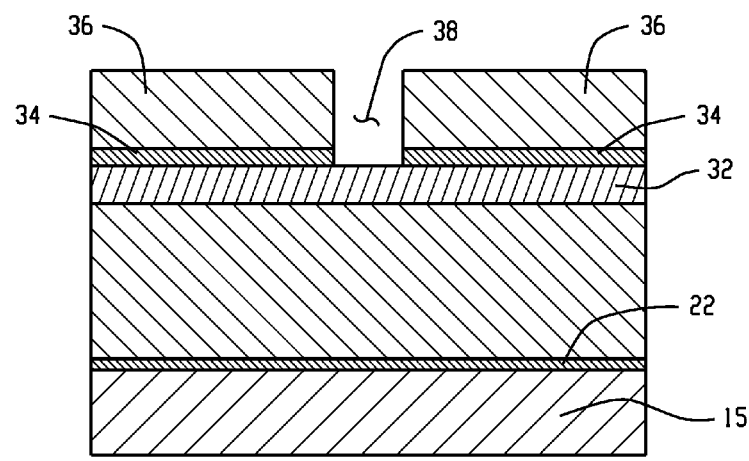
FIG. 9 is a cross-sectional view taken generally along line 9-9 in FIG. 8.

With reference to FIGS. 7, 8, 9 in which like reference numerals refer to like features in FIG. 6 and at a subsequent fabrication stage, the hardmask layer 34 may be patterned by removing the hardmask layer 34 over the area of the opening 38 in the photoresist layer 36. The hardmask layer 34 may be removed over the area exposed by the opening 38 with an etching process, such as reactive ion etching (RIE), using a suitable etch chemistry. In an embodiment, an etch chemistry based on carbon tetrafluoride ($CF_4$) may be employed for the reactive ion etch of the hardmask layer 34.

The etching process stops on the material of the conformal layer 32, which operates as an etch stop. The interlayer dielectric layer 26 is protected by the presence of the conformal layer 32 during the etching process patterning the hardmask layer 34. The dielectric material selected for the conformal layer 32 has a high etch rate selectivity to the dielectric material of the hardmask layer 34 and a higher etch rate selectivity to removal than the dielectric material of the interlayer dielectric layer 26. The etch rate selectivity between the dielectric material of the conformal layer 32 and the dielectric material of the hardmask layer 34 may be greater than or equal to 30:1. The resistance of the conformal layer 32 against removal maintains the thickness of the composite dielectric layer, which leads to a reduction in the height requirement of the sacrificial gate structures 11-13 at the location of the gate cut because the conventional recessing of the interlayer dielectric layer 26 during the hardmask patterning in preparation for the gate cut is eliminated.

Figure 10:
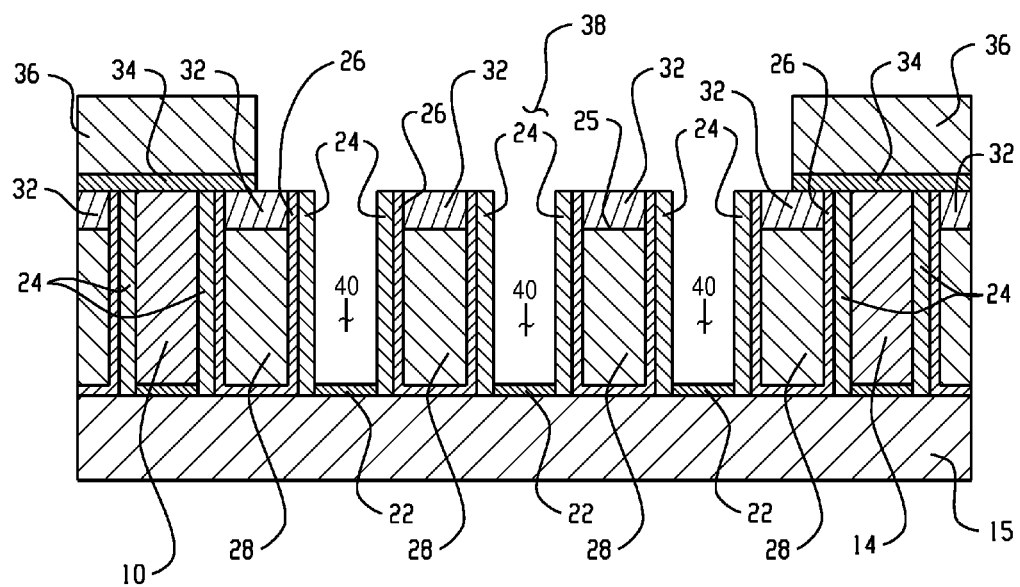
FIG. 10 is a cross-sectional view of the substrate portion similar at a fabrication stage subsequent to FIG. 7.

With reference to FIG. 10 in which like reference numerals refer to like features in FIGS. 7, 8, 9 and at a subsequent fabrication stage, the sacrificial gate structures 11, 12, 13 are removed to form cavities 40 between the spacers 24 at locations designated to provide gate cuts that divide the sacrificial gate structures 11, 12, 13 into disconnected segments. The removal of the sacrificial gate structures 11, 12, 13 at the given locations is selective to the materials of the spacers 24, the conformal layer 32. The dielectric layer 22 is exposed at the bottom of each of the cavities.

Each gate cut interrupts the continuity of the respective sacrificial gate structures 11, 12, 13 and segments each of the sacrificial gate structures 11, 12, 13 at the location of the gate cut. A linear segment of sacrificial gate structure 11 is separated from another linear segment of sacrificial gate structure 11 by one of the cavities 40. Similarly, a linear segment of sacrificial gate structure 12 is separated from linear another segment of sacrificial gate structure 12 by one of the cavities 40, and a linear segment of sacrificial gate structure 13 is separated from another linear segment of sacrificial gate structure 13 by one of the cavities 40. Sacrificial gate structure 10 and sacrificial gate structure 14 are covered by the hardmask layer 34 and, therefore, are protected against etching and not cut. The hardmask layer 34 and photoresist layer 36 may be stripped after the sacrificial gate structures 11, 12, 13 are removed, followed by a conventional cleaning process.

The dielectric material selected for the conformal layer 32 has a higher etch rate selectivity to the semiconductor material of the sacrificial gate structures 11, 12, 13 to removal during the gate cut than the dielectric material of the interlayer dielectric layer 26, and a higher etch rate selectivity to removal during the gate cut than the dielectric material of the interlayer dielectric layer 26. The interlayer dielectric layer 26 is protected by the presence of the conformal layer 32 during the etching process removing the portions of the sacrificial gate structures 11, 12, 13 to define the cut. The resistance of the conformal layer 32 against removal maintains the thickness of the composite dielectric layer, which leads to a reduction in the height requirement of the sacrificial gate structures 10-14 because the conventional recessing of the interlayer dielectric layer 26 during the performance of the gate cut is eliminated.

Figure 11:
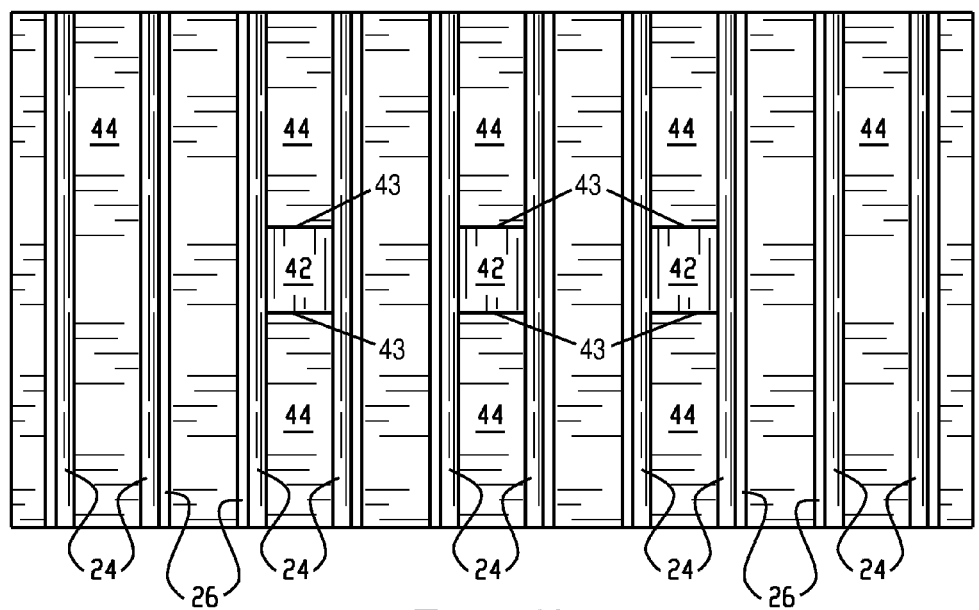
FIG. 11 is a top view of the substrate portion at a fabrication stage subsequent to FIG. 10.

With reference to FIG. 11 in which like reference numerals refer to like features in FIG. 10 and at a subsequent fabrication stage, the cavities 40 (FIG. 10) at the locations of the removed portions of the sacrificial gate structures 11, 12, 13 may be filled with a dielectric layer 42 comprised of an electrical insulator, such as silicon dioxide. The dielectric layer 42 extends from the spacer 24 on one side of each cavity 40 to the spacer 24 on the opposite side of each cavity 40.

Subsequently, the sacrificial gate structures 10 and 14, as well as the segments of the sacrificial gate structures 11, 12, 13 that are created by the gate cut, are replaced with functional gate structures 44 of field-effect transistors. Due to the gate cut, some of the functional gate structures 44 have ends 43 that are spaced apart from each other at the location of the gate cut. These functional gate structures 44 and, more specifically, the ends 43 of the functional gate structures 44 have an end-to-end arrangement at the location of the gate cuts, which are now filled by sections of the dielectric layer 42. The sections of the dielectric layer 42 function as isolation regions to provide electric isolation between the adjacent ends 43 of the functional gate structures 44 by interrupting electrical continuity. These sections of the dielectric layer 42, which are the product of gap-file of the gate cut segmenting the sacrificial gate structures 11, 12, 13, result in multiple linearly-aligned functional gate structures 44 replacing each of the sacrificial gate structures 11, 12, 13. The dielectric layer 42 may be comprised of an electrical insulator, such as silicon dioxide ($SiO_2$) deposited by CVD.

The term "sacrificial gate structure" as used herein refers to a temporary placeholder structure for a functional gate structure to be subsequently formed. The term "functional gate structure" as used herein refers to a permanent gate structure used to control output current (i.e., flow of carriers in the channel) of a semiconductor device.

Silicidation, middle-of-line (MOL) processing, and back-end-of-line (BEOL) processing follows, which includes formation of contacts and wiring for the local interconnect structure overlying the device structure, and formation of dielectric layers, via plugs, and wiring for an interconnect structure coupled by the interconnect wiring with the field effect transistors.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first dummy gate structure;
   forming a first dielectric layer adjacent to the first dummy gate structure;
   forming a second dielectric layer on the first dielectric layer; and
   after the second dielectric layer is formed, removing a portion of the first dummy gate structure with an etching process to cut the first dummy gate structure into disconnected segments,
   wherein the second dielectric layer caps the first dielectric layer when the portion of the first dummy gate structure is removed, and the second dielectric layer has a higher etch rate selectivity than the first dielectric layer to the etching process.

2. The method of claim 1 wherein the first dummy gate structure has a top surface, the first dielectric layer has a top surface, and further comprising:
before the second dielectric layer is formed, recessing the top surface of the first dielectric layer relative to the top surface of the first dummy gate structure.

3. The method of claim 2 wherein the top surface of the first dielectric layer is recessed to a given depth relative to the top surface of the first dummy gate structure, and forming the second dielectric layer on the top surface of the first dielectric layer comprises:
conformally depositing the second dielectric layer with a thickness that is greater than the given depth; and
planarizing the second dielectric layer to the top surface of the first dummy gate structure.

4. The method of claim 2 further comprising:
before the top surface of the first dielectric layer is recessed relative to the top surface of the first dummy gate structure, planarizing the first dummy gate structure to be coplanar with the top surface of the first dielectric layer.

5. The method of claim 1 wherein the first dielectric layer is comprised of silicon dioxide, and the second dielectric layer is comprised of a dielectric material having a dielectric constant that is less than a dielectric constant of silicon dioxide.

6. The method of claim 1 wherein the first dielectric layer is comprised of silicon dioxide, and the second dielectric layer is comprised of silicon oxycarbide.

7. The method of claim 1 wherein the first dielectric layer is comprised of silicon dioxide, and the second dielectric layer is comprised of silicon oxycarbonitride.

8. The method of claim 1 further comprises:
forming a cut mask with an opening that exposes the portion of the first dummy gate structure for removal,
wherein the second dielectric layer caps the first dielectric layer when the cut mask is formed.

9. The method of claim 8 wherein the second dielectric layer masks the first dielectric layer during the etching of the first dummy gate structure with the etching process.

10. The method of claim 8 wherein the cut mask is comprised of silicon nitride, and the second dielectric layer is comprised of silicon oxycarbide.

11. The method of claim 8 wherein the cut mask is comprised of silicon nitride, and the second dielectric layer is comprised of silicon oxycarbonitride.

12. The method of claim 8 further comprising:
forming a second dummy gate structure adjacent to the first dummy gate structure,
wherein the mask layer masks the second dummy gate structure when the cut mask is formed.

13. The method of claim 12 where the second dummy gate structure is masked by the cut mask when the portion of the first dummy gate structure is removed.

14. The method of claim 1 further comprising:
filling a cavity between the disconnected segments of the first dummy gate structure with a section of a third dielectric layer.

* * * * *